United States Patent [19]

Shimozato et al.

[11] Patent Number: 4,587,134
[45] Date of Patent: May 6, 1986

[54] METHOD OF RAPIDLY CHANGING DEPOSITION AMOUNT IN A CONTINUOUS VACUUM DEPOSITION PROCESS

[75] Inventors: Yoshio Shimozato; Tetsuyoshi Wada; Kenichi Yanagi; Mitsuo Kato; Heizaburo Furukawa; Kanji Wake, all of Hiroshima; Arihiko Morita, Sakai; Norio Tsukiji, Sakai; Takuya Aiko, Sakai; Toshiharu Kittaka, Sakai; Yasuji Nakanishi, Sakai, all of Japan

[73] Assignees: Nisshin Steel Company, Ltd.; Mitsubishi Jukogyo Kabushiki Kaisha, both of Tokyo, Japan

[21] Appl. No.: 735,442

[22] Filed: May 17, 1985

[30] Foreign Application Priority Data

May 28, 1984 [JP] Japan .................. 59-106396

[51] Int. Cl.$^4$ .................................. C23C 14/54
[52] U.S. Cl. .................... 427/10; 427/251; 118/665; 118/726
[58] Field of Search ............ 427/10, 250, 251, 248.1; 118/665, 692, 712, 715, 718, 720, 726, 664

[56] References Cited

U.S. PATENT DOCUMENTS

| | | | |
|---|---|---|---|
| 3,281,265 | 10/1966 | Cauley | 118/665 X |
| 3,602,190 | 8/1971 | Kral, Jr. et al. | 118/665 |
| 4,061,800 | 12/1977 | Anderson | 118/726 |
| 4,374,162 | 2/1983 | Takagi | 427/248.1 |
| 4,425,871 | 1/1984 | Martin | 118/664 |
| 4,495,889 | 1/1985 | Riley | 118/692 |

FOREIGN PATENT DOCUMENTS

| | | | |
|---|---|---|---|
| 48-17153 | 5/1973 | Japan | 118/664 |
| 1010456 | 11/1965 | United Kingdom | 118/712 |

OTHER PUBLICATIONS

Budo et al., "Extended Virtual Evaporation Source and Deposition Device, IBM Tech. Discl. Bulletin, vol. 19, No. 8, Jan. 1977, pp. 2826–2827.

Primary Examiner—Bernard F. Plantz
Attorney, Agent, or Firm—Webb, Burden, Robinson & Webb

[57] ABSTRACT

In the continuous vapor deposition coating of a metal strip, the coating amount can be rapidly changed by keeping the vapor flow at acoustic velocity and changing the cross-sectional area of the vapor path.

6 Claims, 12 Drawing Figures

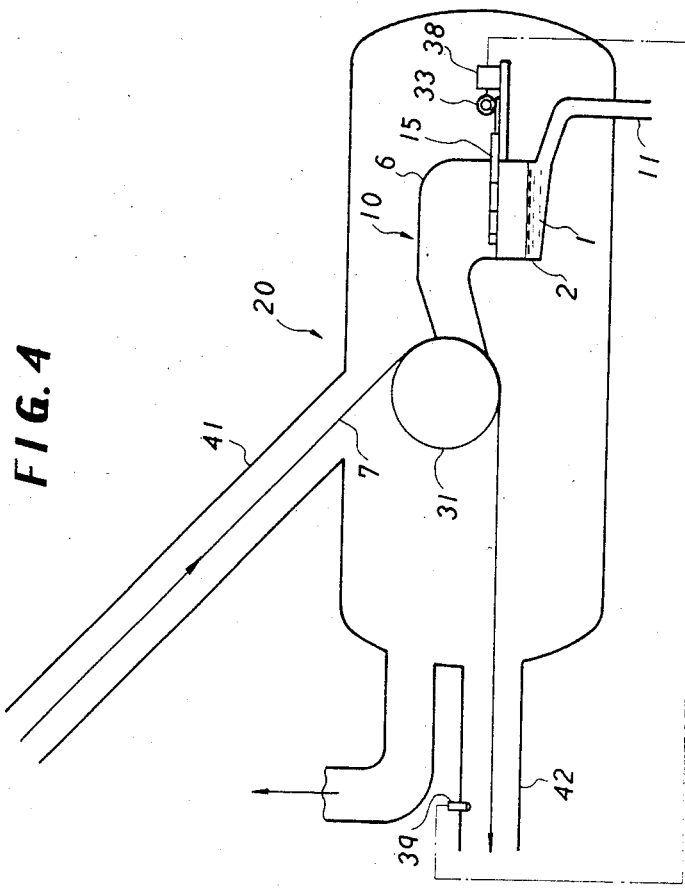

METHOD OF RAPIDLY CHANGING DEPOSITION AMOUNT IN A CONTINUOUS VACUUM DEPOSITION PROCESS

FIELD OF THE INVENTION

This invention relates to a vacuum deposition process. More particularly, this invention relates to a method for rapidly changing deposition amount in a continuous vacuum deposition process.

BACKGROUND OF THE INVENTION

A conventional continuous vacuum deposition apparatus comprises an evaporation chamber in which a metal to be deposited, such as zinc, for instance, is vaporized and a channel which leads the vapor of the metal to the surface of a substrate metal sheet, such as a steel strip for instance, which runs at the opening of the channel and a shutter means is provided at the junction of said evaporation chamber and said vapor channel. The shutter is either of a butterfly type or of a sliding type.

Control of the deposition amount (coating weight) is effected by changing the electric power supplied to the heater of the melting bath and conditioning the aperture of the shutter means. With such means, however, the change in the deposition amount is gradual and takes some time; it cannot be instantaneously changed. This means that the transitional portions of the metal sheet have a coating of varying thickness, and must therefore be scrapped, which is a waste of material.

This invention is intended to solve the above-described problem of the prior art and to provide a method for instantaneously controlling the metal vapor supply in a vacuum deposition apparatus.

We have found that the above problem can be solved by utilizing the so-called choke phenomenon. That is, the vapor flow can be instantaneously changed by choking the flow (providing the flow with acoustic velocity), thus enabling the deposition amount to be changed rapidly.

DISCLOSURE OF THE INVENTION

This invention provides a method for rapidly changing the deposition amount in a vacuum deposition process comprising restricting the aperture of the shutter provided at the junction of the metal evaporation chamber and the vapor channel of the vacuum deposition apparatus to an area which chokes the vapor flow, changing the shutter aperture while maintaining the choked condition, and then changing the electric power supply to the heater of the evaporation chamber in response to the change in the shutter aperture area.

The principle of this invention will now be explained. When a gas flows through an orifice the pressure on the upstream side of the orifice is referred as $P_1$ and that on the downstream side as $P_2$. If the ratio of the upstream side pressure to the downstream side pressure becomes extremely large, and the flow rate reaches acoustic velocity at the orifice, the flow rate is determined by the upstream side pressure $P_1$ only. This is called "choke phenomenon".

Generally, flow rate G is determined by $P_2$ under the condition that $P_1$ is constant, and the next relation exists:

$$G \propto \rho v S \quad (1)$$

wherein $$v = \sqrt{(P_1 - P_2)/\rho}$$

G: flow rate $(M/T^{-1})$
v: flow velocity $(L/T^{-1})$
S: area of orifice
$\rho$: density of gas.

That is, as $P_2$ is reduced, v increases and thus the flow rate G increases. The flow rate G, which is proportional to the product of $\rho$ and v, increases as $P_2$ decreases, and reaches a maximum when the flow velocity reaches acoustic velocity. This is the choke phenomenon and when a flow is choked, the above relation (1) becomes:

$$G \propto P_1 S \quad (2)$$

The method of this invention is characterized in that the vacuum deposition apparatus is operated so that the choke condition is satisfied both before the change in the aperture area (when the shutter aperture is $S_0$) and after the change (when the shutter aperture is $S_1$) and thus the deposition amount can be very rapidly controlled.

Designate the conditions before the change as:
Flow rate: $G_o$
Pressure in evaporation chamber: $P_o$
Shutter Aperture: $S_o$
and designate the conditions after the change as:
Flow rate: $G_1$
Pressure in evaporation chamber: $P_1$
Shutter Aperture: $S_1$ Thus the shutter structure is designed so that the pressure in the evaporation chamber is sufficiently high compared with the pressure in the channel, so the vapor flow is choked at the shutter aperture. When the shutter is thus designed, the flow rate is determined by the upstream side pressure only, since there is a high pressure difference between the upstream side and the downstream side and the vapor flow is choked at the shutter. Therefore, there are relationships $G_o = kS_oP_o$ (before change) and $G_1 = kS_1P_1$ (after change), wherein k is a constant based on the specific heat ratio ($\kappa$).

Thus there is the following relation with respect to the flow rate:

$$G_1 = G_o \frac{S_1 P_1}{S_o P_o} \quad (3)$$

On the other hand, if the saturation vapor pressure for a molten bath temperature (temperature of the evaporation chamber) is taken as $P_s$, the flow rate is expressed as:

$$G_1 = G_o \frac{P_s - P_1}{P_s - P_o} \quad (4)$$

since evaporation is proportional to the difference between the saturation vapor pressure and the pressure in the evaporation chamber. And if $P_1$ is eliminated from equations (3) and (4), $$\frac{G_1}{G_o} = \frac{\left(\frac{S_1}{S_o}\right)}{\frac{P_o}{P_s} + \frac{S_1}{S_o}\left(1 - \frac{P_o}{P_s}\right)} \quad (5)$$

According to equation (5), the flow rate after an aperture change is determined by shutter aperture ratio ($S_1/S_o$) and the ratio ($P_o/P_s$) of the pressure in the evaporation chamber before aperture change ($P_o$) to the saturation vapor pressure for a temperature of the molten bath ($P_s$).

The condition under which choke occurs is as follows:

$$\frac{P_{ch}}{P_v} < \left(\frac{2}{\kappa+1}\right)^{\frac{\kappa}{\kappa-1}} \quad (6)$$

wherein $P_{ch}$ is the pressure in the channel (downstream of the shutter) at the occurrence of choke, $P_v$ is the pressure in the evaporation chamber and $\kappa$ is the specific heat ratio as mentioned above. For a gas of which $\kappa=1.4$ (zinc vapor), choke occurs when $P_{ch}/P_v \leq 0.52$.

Specifically, control of vapor supply is effected as follows. The state before aperture change is adjusted as described above. The flow rate is given by the following equation:

$$G_o = S_o P_o \left(\frac{2}{\kappa+1}\right)^{\frac{\kappa+1}{2(\kappa-1)}} \sqrt{\frac{\kappa M}{RT}} \quad (7)$$

wherein
$\kappa$: specific heat ratio
R: universal gas constant
T: vapor temperature
M: molecular weight of vapor
In the same way, for $G_1$ $$G_1 = S_1 P_1 \left(\frac{2}{\kappa+1}\right)^{\frac{\kappa+1}{2(\kappa-1)}} \sqrt{\frac{\kappa M}{RT}} \quad (8)$$

The method of this invention is achieved by providing a shutter structure by which shutter apertures which satisfy the conditions (7) and (8) can be established under the condition (6).

When the aperture change is effected as described above, however, the changed flow rate will not be maintained if the electric power applied to the heater of the evaporation chamber remains as is, because change in the flow rate will cause change in the evaporation and the latter change will cause change in the bath temperature. Therefore, when the shutter aperture is changed, the power supply has to be changed in response to the change in the shutter aperture so as to compensate for the change in evaporation.

In the method of this invention, the aperture of the shutter of the evaporation chamber is adjusted so as to choke the vapor flow in accordance with the above described principle. Thus the vapor flow rate can be instantaneously changed by changing the aperture of the shutter aperture, and the change is further secured by changing the electric power supply to the evaporation bath heater. Thus the deposition amount can be rapidly controlled.

The method of the present invention is also applicable when the coating amount is changed from 0 to some amount.

The invention will now be specifically described with reference to the attached drawings.

BRIEF DESCRIPTION OF THE ATTACHED DRAWINGS

Figure 3A:
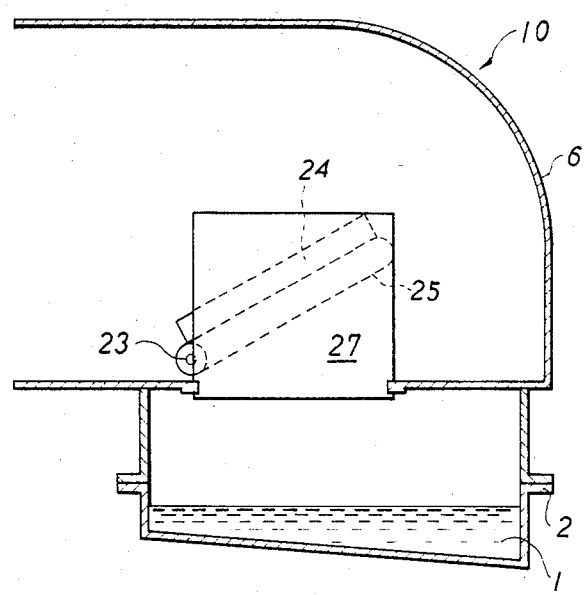
Figure 3B:
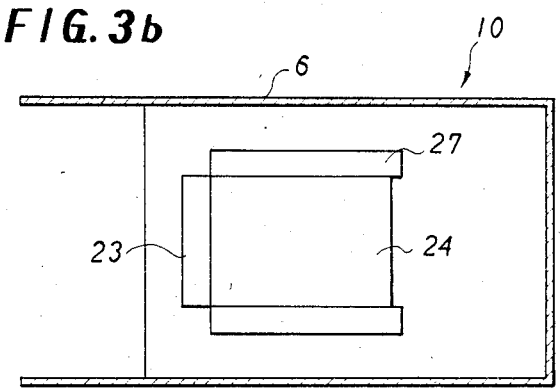

FIGS. 3(a) and 3(b) are drawings showing another embodiment of the apparatus used for the method of the present invention wherein a butterfly type shutter is used.

FIG. 4 is a drawing showing still another embodiment of the apparatus used for the method of the present invention wherein a detector is provided for detecting the amount of deposition on the sheet.

Figure 5:
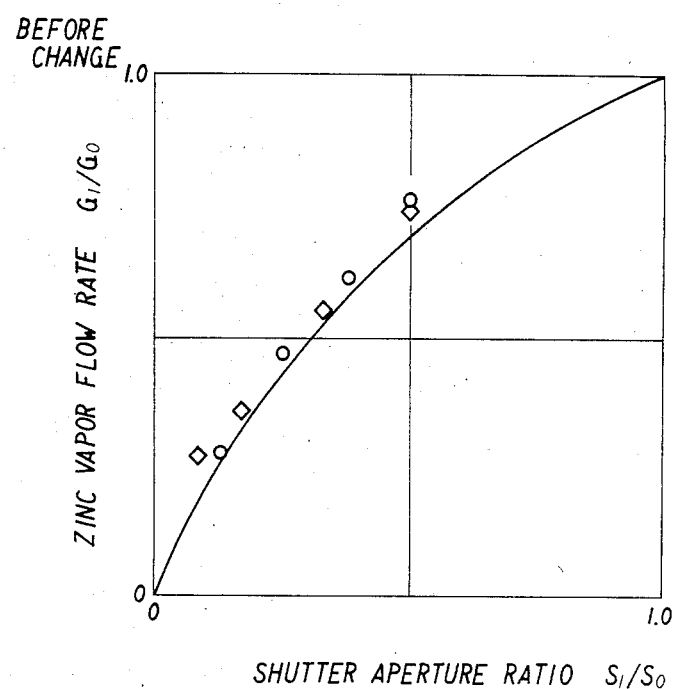

FIG. 5 is a graph showing a theoretical curve of results based on the present invention and the measured results from Example 1.

Figure 6:
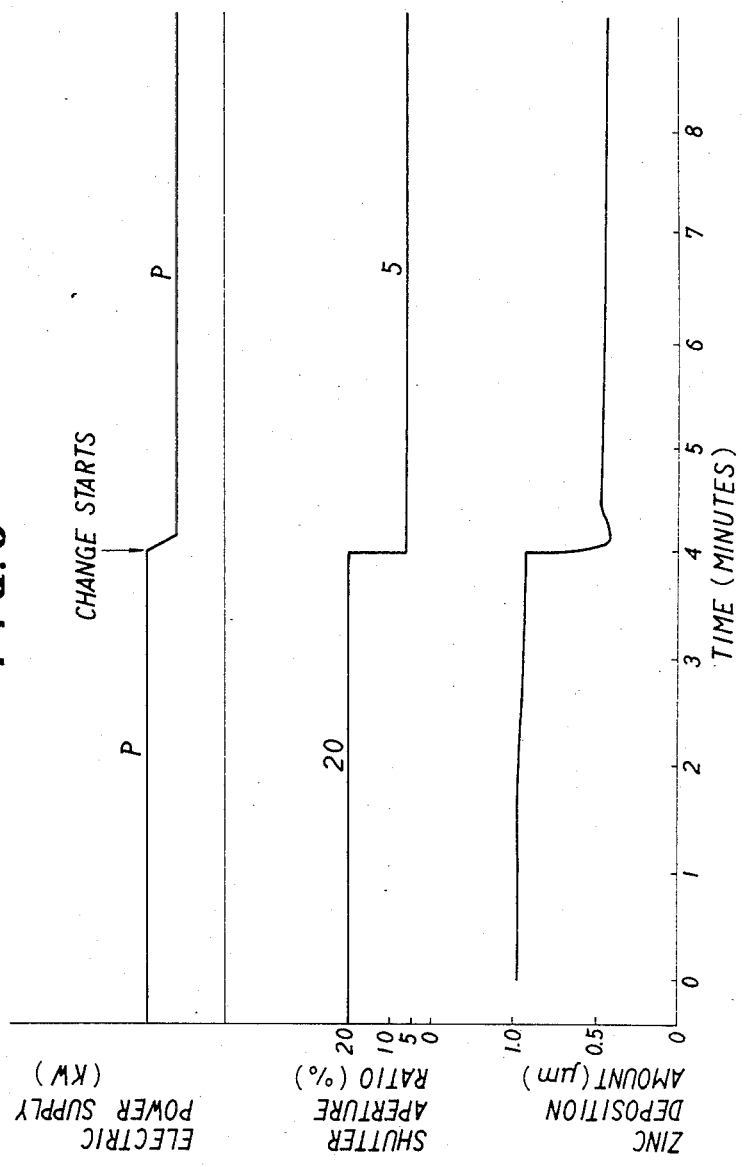

FIG. 6 is a drawing illustrating the working of Example 2.

Figure 7A:
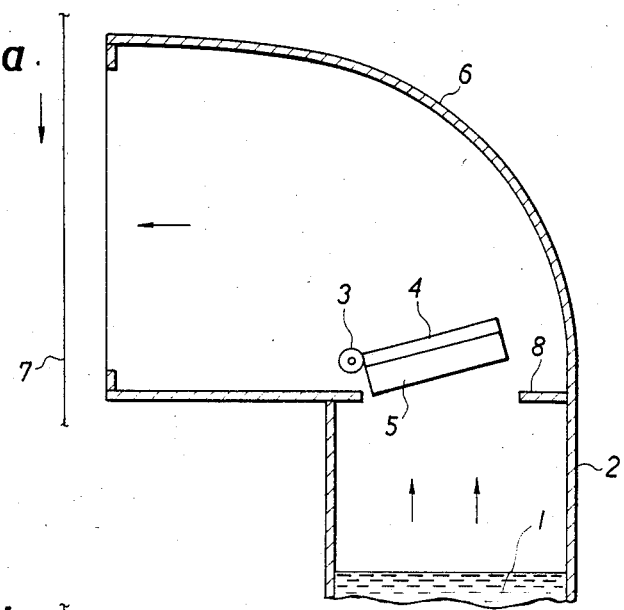
Figure 7B:
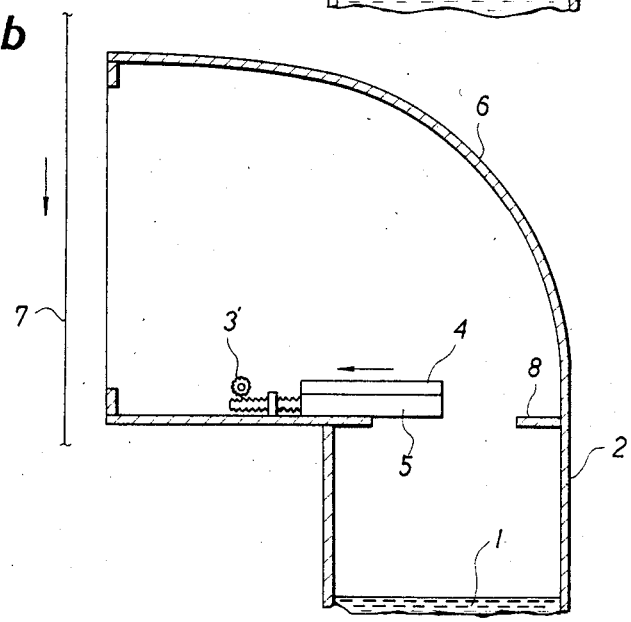
Figure 7C:
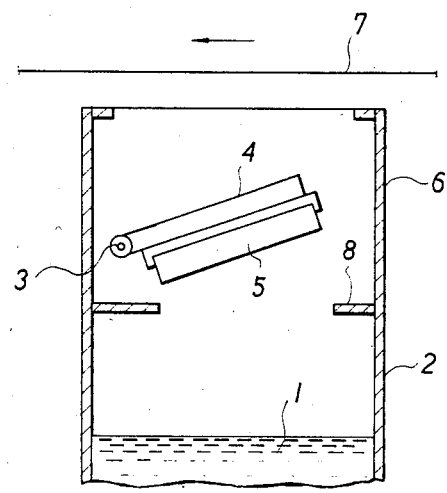

FIGS. 7(a), 7(b) and 7(c) are drawings illustrating conventional vacuum deposition apparatuses.

Figure 8:
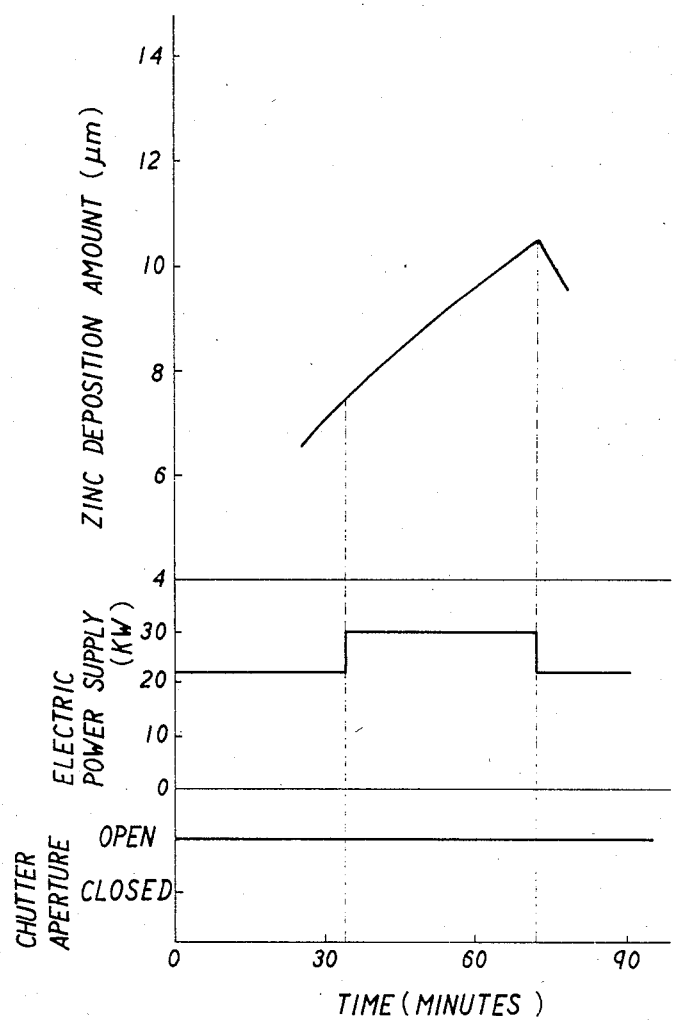
Figure 9:
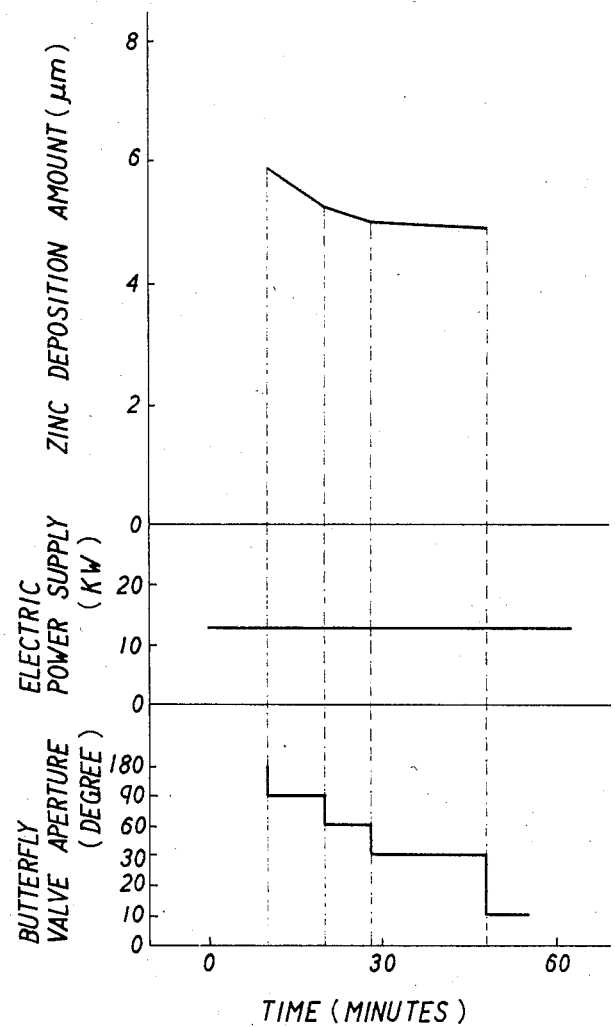

FIGS. 8 and 9 are graphs illustrating change in the zinc deposition amount when the vacuum deposition is carried out in accordance with the conventional method. FIG. 8 shows the change when only the electric power supply to the heater is changed. FIG. 9 shows the change when only the shutter aperture is changed.

SPECIFIC DESCRIPTION OF EMBODIMENTS OF THE INVENTION

The structures of vacuum deposition apparatuses of the prior art are schematically illustrated in FIGS. 7(a), 7(b) and 7(c). The apparatuses comprise an evaporation chamber 2 in which a molten metal 1 is electrically heated to be vaporized in vacuo and a vapor channel 6 via which the metal vapor is directed to a substrate metal sheet (strip) 7. The apparatuses of FIGS. 7(a) and 7(b) are adapted to a vertical vacuum deposition line and that of FIG. 7(c) is for a horizontal vacuum deposition line. A shutter 5 is provided at the junction of the evaporation chamber and the vapor channel. In FIGS. 7(a) and 7(c) the shutter is a butterfly type and in FIG. 7(b) it is a slide shutter. The shutter is usually provided with a heater 4 for the purpose of preventing undesired solidification of metal vapor thereto. The butterfly valve is pivoted around a shaft 3 and the slide valve is moved horizontally by a rack-and-pinion means 3'. At the junction, a splash-prevention board is usually provided. The deposition amount is controlled by changing the shutter aperture and electric power applied to the heater of the evaporation bath.

With such an apparatus and method, however, the change in the deposition amount is not instantaneous but gradual. This fact is diagrammatically illustrated in FIG. 8 and FIG. 9 with respect to the vacuum deposition of zinc.

In FIG. 8 the abscissa stands for time (minutes), and shutter aperture, power supply to the evaporation heater and deposition amount (thickness, in $\mu$m) are scaled on the ordinate from the bottom in this order. When the shutter is kept open at a constant aperture and the electric power supply is increased by 8 KW in one step, the deposition amount gradually increases, and when the electric power supply is returned to the initial level, the deposition amount gradually decreases.

In FIG. 9, the abscissa stands for time (minutes), and butterfly shutter aperture, electric power supply and deposition amount are scaled on the ordinate from the bottom in this order. When the electric power supply is kept constant and only the butterfly valve aperture is decreased step by step from 90° to 60°, 30° and 10°, the change in deposition amount does not sensitively follow the aperture changes.

Even if the above two procedures are combined, sharp instantaneous change in the deposition amount cannot be expected.

Figure 1:
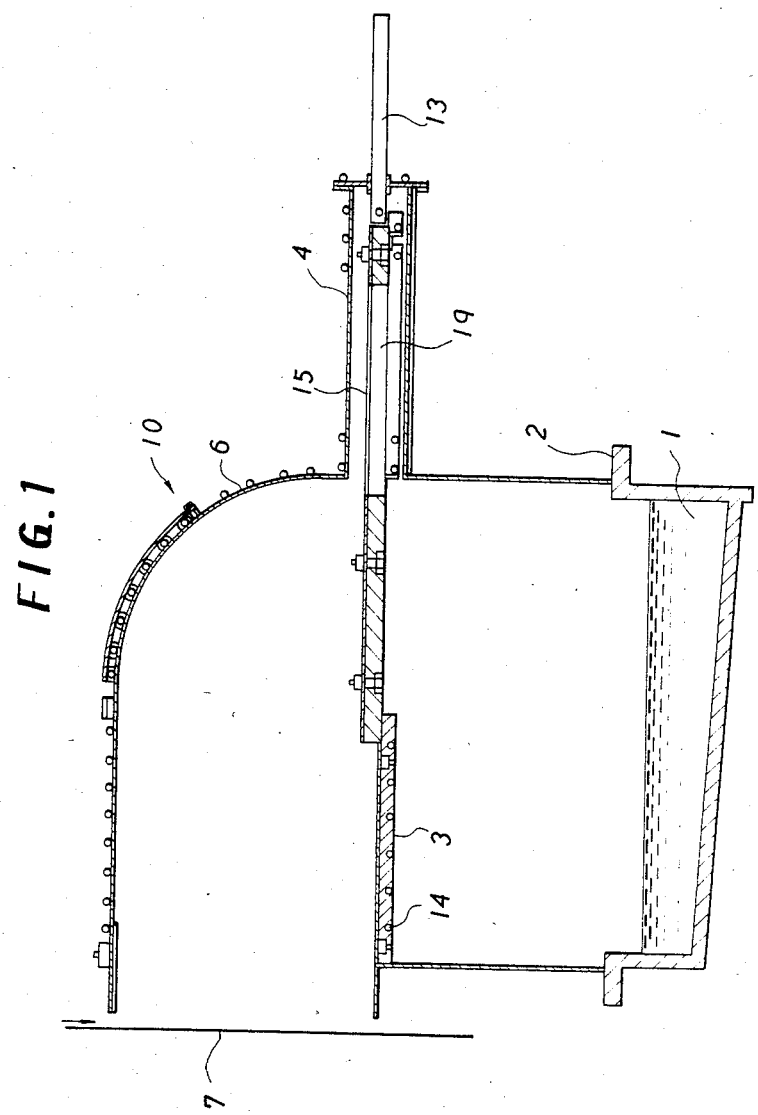
FIG. 1 is a drawing showing an embodiment of the vacuum deposition apparatus used for the method of the present invention.

FIG. 1 shows an embodiment of a vacuum deposition apparatus used for the method of the present invention. The apparatus comprises an evaporation chamber 2 and a vapor channel 6, the chamber and the channel forming substantially one chamber separated by a partition 3. A shutter 15 and a shutter case 4 are provided at the partition 3. The sliding shutter 15 (in this particular embodiment) is operated by means of a driving rod 13 which is supported by the end plate of the shutter case 4. The shutter 15 has an opening 19. It is desirable to design the shutter so that a small aperture remains even when the shutter is closed. When the method is applied for changing the coating amount from 0 to a certain amount, the shutter must be able to be completely closed.

Usually the vapor channel wall, the partition and the shutter case are provided with electric heating means to prevent undesired deposition of metal. The underpart of the evaporation chamber constitutes a melting bath in which the metal 1 to be deposited is melted and evaporated. Although not shown in the drawing, the melting bath is provided with means for replenishment with fresh molten metal from a source placed outside of the vacuum system.

A metal sheet or strip 7 to be coated moves past the opening of the channel 6. The whole apparatus is housed in a large vacuum housing as shown in FIG. 4, and the metal strip is introduced into the housing (and then into the deposition apparatus) through a seal roll system or the like known per se. Such seal roll systems are disclosed in Japanese Patent Publication No. 18646/72, Japanese Patent Publication No. 20950/78, etc.

The general construction of this apparatus is the same as that of the prior art except the shutter part is designed in accordance with the principle of this invention.

FIGS. 3(a) (side view) and 3(b) (plan view) schematically show modifications of the above apparatus. In this embodiment, there are provided a butterfly valve 25, which is pivotable about a shaft 23, a heater 24, and a pair of screens or partitions 27 are provided one on either side of the shutter. In the case of a butterfly shutter, the aperture or aperture area cannot be clearly defined. Providing a butterfly valve with a pair of partitions enables the shutter aperture to be defined.

FIG. 4 is an overall view of the vacuum deposition apparatus provided with a coating thickness detector. The vacuum deposition apparatus 10 is contained in a vacuum housing 20, which is evacuated through an exhaust duct 40. The vacuum deposition apparatus 10 is substantially the same as previously described. However, a shutter driving means 33 (such as motor), a shutter drive control means 38 and a suction pipe 11 to replenish the molten metal are shown here. The housing 20 is provided with an inlet path 41 and an outlet path 42 along which passes the metal strip 7 to be coated. The opening ends of these paths are hermetically sealed by means of a vacuum seal roll system as mentioned above to let the metal strip 7 pass into and out of the vacuum housing hermetically, although they are not shown in the drawing.

In the embodiment shown in this drawing, a coating thickness detector 39 is provided on the outlet path 42. The detector can be radiation thermometer. Thickness can be detected by determining the temperature of coated film. The thicker portion is of higher temperature. Thickness also can be detected by an X-ray fluorescent analyzer. This apparatus is provided outside of the housing.

The metal strip 7 hermetically introduced into the housing 20 passes along the inlet path 41 and around a guide roll 31, where it is coated, and moves along the outlet path 42, where a coating thickness detector 39 is mounted. The information collected by the detector 39 is fed back to the automatic shutter drive control means 38 to provide more precise control of the coating thickness. Such a feedback control system is today commercially available or easily constructed by a technician with ordinary knowledge of microcomputer technology.

The method of this invention will be better understood by the working examples described below.

EXAMPLE 1

A mild steel strip 0.6 mm in thickness and 300 mm in width was vacuum deposition-coated with zinc using apparatus of FIG. 1.

Figure 2:
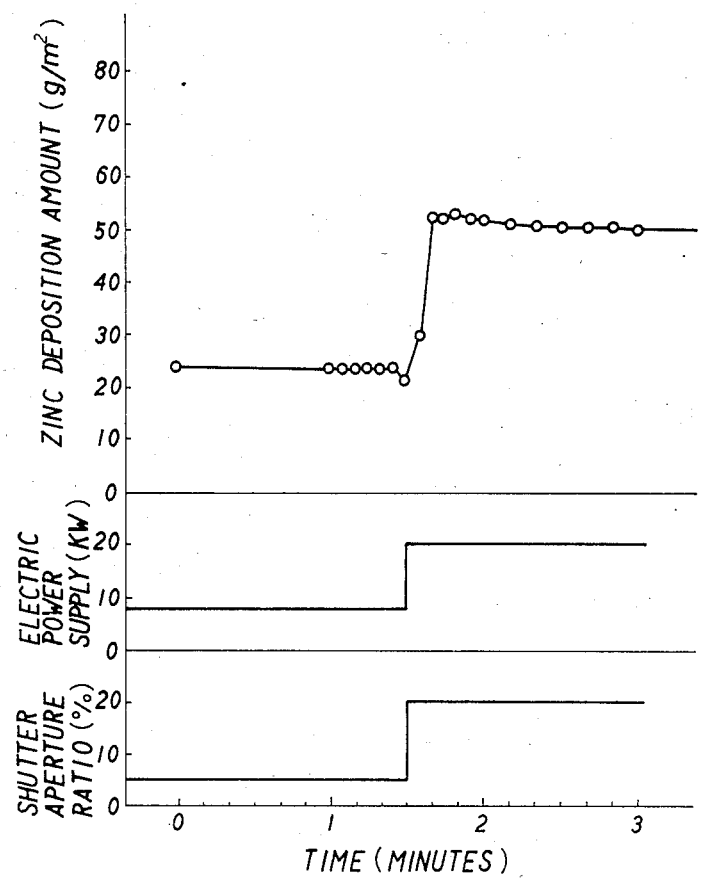
FIG. 2 is a graph showing the results of zinc vapor deposition control in accordance with the present invention.

The evaporation chamber was 103 mm in length, 474 mm in width and 490 mm in height. The largest area of the shutter aperture was 144000 mm$^2$. Even when the valve was fully maximally opened, the choke condition, that is, $P_{ch}/P_v < 0.52$ was satisfied at temperature 520° C. The operation and results are illustrated in FIG. 2. The abscissa stands for time (minute). On the ordinate, the shutter aperture (%), electric power applied to the heater of the evaporation chamber (KW) and the coating weight (g/m$^2$) are scaled from the bottom in this order.

For the first 1.5 minutes, zinc vacuum coating was carried out with a shutter aperture of 5% and an electric power supply of 8 KW, and a zinc coating of 24 g/m$^2$ was effected. Thereafter, the shutter aperture was increased to 20% and the electric power supply was increased to 20 KW simultaneously. These were effected virtually instantaneously. The choke condition was well maintained. Thus the coating weight increased to 54 g/m$^2$ within 15 seconds. Thereafter, the coating weight smoothly decreased slightly, but it was stabilized at 50 g/m$^2$ within 1 minute. The strip speed was 20 m/min. So the transitional portion having irregular coating weight, which had to be scrapped, was only 5 m. There is no precedent to be compared with. But if we consider the results shown in FIGS. 8 and 9, this is a remarkable effect.

The coating amount control test was repeated and the relation between the coating amount change ratio, which means the flow rate change ratio ($G_1/G_o$), and the shutter aperture change ratio ($S_i/S_o$) was checked. The result is shown in FIG. 5. In this diagram, the abscissa stands for the shutter aperture change ratio $S_i/S_o$ and the ordinate represents the coating amount change ratio and the real line curve represents values calculated from the mathematical formula described above and the dots in small squares or circles represent actually measured values. From this, reliability or accuracy of the present method will be understood.

EXAMPLE 2

The similar zinc vacuum deposition coating was carried out using an apparatus as illustrated in FIG. 1. This time, the coating amount was decreased. The results are schematically illustrated in FIG. 6. The abscissa stands for elapsed time (minutes) and the ordinate represents zinc coating amount ($\mu$m), shutter aperture (%) and electric power supply. The decreased coating amount stabilized in about 30 seconds. In the prior art method, this required at least 90 minutes.

We claim:

1. A method for rapidly changing deposition amount in a vacuum deposition process comprising restricting the aperture of a shutter provided at the junction of the metal evaporation chamber and the vapor channel of the vacuum deposition apparatus to an area which chokes the vapor flow, changing the shutter aperture while maintaining the choked condition, and then changing the electric power supply to the heater of the evaporation chamber in response to the change in the shutter aperture area.

2. The method of claim 1, in which the shutter is a slide shutter.

3. The method of claim 1, in which the shutter is a butterfly valve.

4. The method of claim 3, in which the butterfly valve is provided with a pair of partitions one on either side thereof.

5. The method of claim 1, in which zinc is deposited.

6. The method of claim 1, in which the thickness of the deposited film is detected and the detected information is fed back to the automatic control means of the shutter so that the shutter aperture is changed so as to compensate the variation in the thickness.

* * * * *